(12) United States Patent
Bogner et al.

(10) Patent No.: US 10,079,610 B2
(45) Date of Patent: Sep. 18, 2018

(54) BUILT-IN SELF-TEST FOR ADC

(71) Applicant: Infineon Technologies AG, Neubiberg (DE)

(72) Inventors: Peter Bogner, Wernberg (AT); Andreas Kalt, Treffen (AT); Jaafar Mejri, Ottobrunn (DE); Martin Pernull, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/742,435

(22) PCT Filed: Jul. 5, 2016

(86) PCT No.: PCT/EP2016/065864
§ 371 (c)(1),
(2) Date: Jan. 5, 2018

(87) PCT Pub. No.: WO2017/005748
PCT Pub. Date: Jan. 12, 2017

(65) Prior Publication Data
US 2018/0198460 A1     Jul. 12, 2018

Related U.S. Application Data

(63) Continuation of application No. 14/793,143, filed on Jul. 7, 2015, now abandoned.

(51) Int. Cl.
*H03M 1/10* (2006.01)
*H03M 1/80* (2006.01)

(52) U.S. Cl.
CPC .......... *H03M 1/1071* (2013.01); *H03M 1/109* (2013.01); *H03M 1/804* (2013.01)

(58) Field of Classification Search
CPC .. H03M 1/1071; H03M 1/109; H03M 1/1009; H03M 1/12; H03M 1/468; H03M 1/1061; H03M 1/804
USPC ................. 341/120, 155, 163, 172
See application file for complete search history.

(56) References Cited

U.S. PATENT DOCUMENTS

| | | | | |
|---|---|---|---|---|
| 5,977,893 A | * | 11/1999 | Chen ................... | H03M 1/1071 341/120 |
| 6,545,625 B2 | * | 4/2003 | Hottgenroth ........ | H03M 1/1014 341/120 |
| 8,018,238 B2 | * | 9/2011 | Cormier, Jr. ............ | G06F 3/044 324/678 |
| 8,477,052 B2 | * | 7/2013 | Dey ...................... | H03M 1/109 341/118 |

\* cited by examiner

*Primary Examiner* — Khai M Nguyen
(74) *Attorney, Agent, or Firm* — Shumaker & Sieffert, P.A.

(57) ABSTRACT

Representative implementations of devices and techniques provide a built-in self-test (BIST) for an analog-to-digital converter (ADC). Stimuli needed to test an ADC are generated within the chip containing the ADC. Evaluation circuitry is also available on-chip. Generation and evaluation circuits and systems are based on existing circuits and/or components of the chip.

27 Claims, 13 Drawing Sheets

BUILT-IN SELF-TEST FOR ADC

This Application is U.S. National phase filing of PCT Application Number PCT/EP2016/065864, which claims priority to U.S. application Ser. No. 14/793,143, filed on Jul. 7, 2015, now abandoned, the entire content of which is incorporated herein by reference.

BACKGROUND

Analog-to-digital converters (ADCs) convert time-discrete analog input values to a digital form. A type of ADC, the successive approximation register (SAR) ADC, digitizes the analog input values using a successive approximation search algorithm. While the internal circuitry of the SAR ADC may run at a higher frequency (such as several megahertz (MHz), for example), the sample rate of the SAR ADC is generally a fraction of that frequency (such as several kilohertz (kHz), for example) due to the successive approximation search algorithm used. For example, normally each bit of the SAR ADC is fully realized prior to proceeding on to the next bit.

Since modern ADC devices are highly precise, testing them calls for even more precise stimuli for the results to be of relevance. Providing these high precision stimuli can be expensive. Additionally, in order to reach the required high precision, the stimuli generators often need long settling times, resulting in longer test times.

Often, front-end and back-end testing using automatic test equipment (ATE) is performed as part of ADC production. For production tests using ATE, the ADCs can be tested with architecture-independent methods, such as the linear ramp test or the histogram test. With the linear ramp test method, a slowly changing high-resolution high-linearity voltage ramp is applied to the input of the ADC, and the conversion results are used to determine the ADC transfer curve. The histogram test method uses a predetermined input signal as input to the ADC, and statistically deduces the transfer curve from the observed code histogram.

Both methods often use a minimum number of hits per code to provide usable results. Consequently, the runtime for an n-bit binary ADC grows linearly with the number of possible output codes, which is $2^n$. For high resolution ADCs, this leads to long test times and, as a consequence, high test costs.

A compromise for easier stimulus generation may be achieved by using a first-order resistor-capacitor low pass filter. The inherent mismatch of the RC time constant is measured first, and then the transfer curve can be obtained. As the charge or discharge speed of the capacitance must be adapted to the fastest changing part of the voltage curve, the measurement takes longer than the linear ramp test. Additionally, the high time constant can require an unfeasibly large (external) capacitance.

Expensive stimuli generators and long settling times can lead to increased test costs. Further, when tests are lengthy and expensive, the user may have no simple means to check that the circuits are fully functional during field operation, including throughout the product lifetime. For example, some methods are used for production testing, and are prohibitive for use in the field. This can lead to a violation of specified functional safety requirements of some automotive applications, for example.

Other proposed methods often result in substantial chip area overhead and can also increase the BOM for the customer.

SUMMARY

A built-in self-test arrangement according to claim 1, an analog-to-digital converter according to claim 10 and a method according to claim 17 are provided. The dependent claims define further embodiments.

BRIEF DESCRIPTION OF THE DRAWINGS

The detailed description is set forth with reference to the accompanying FIGURES. In the FIGURES, the left-most digit(s) of a reference number identifies the FIGURE in which the reference number first appears. The use of the same reference numbers in different FIGURES indicates similar or identical items.

For this discussion, the devices and systems illustrated in the FIGURES are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
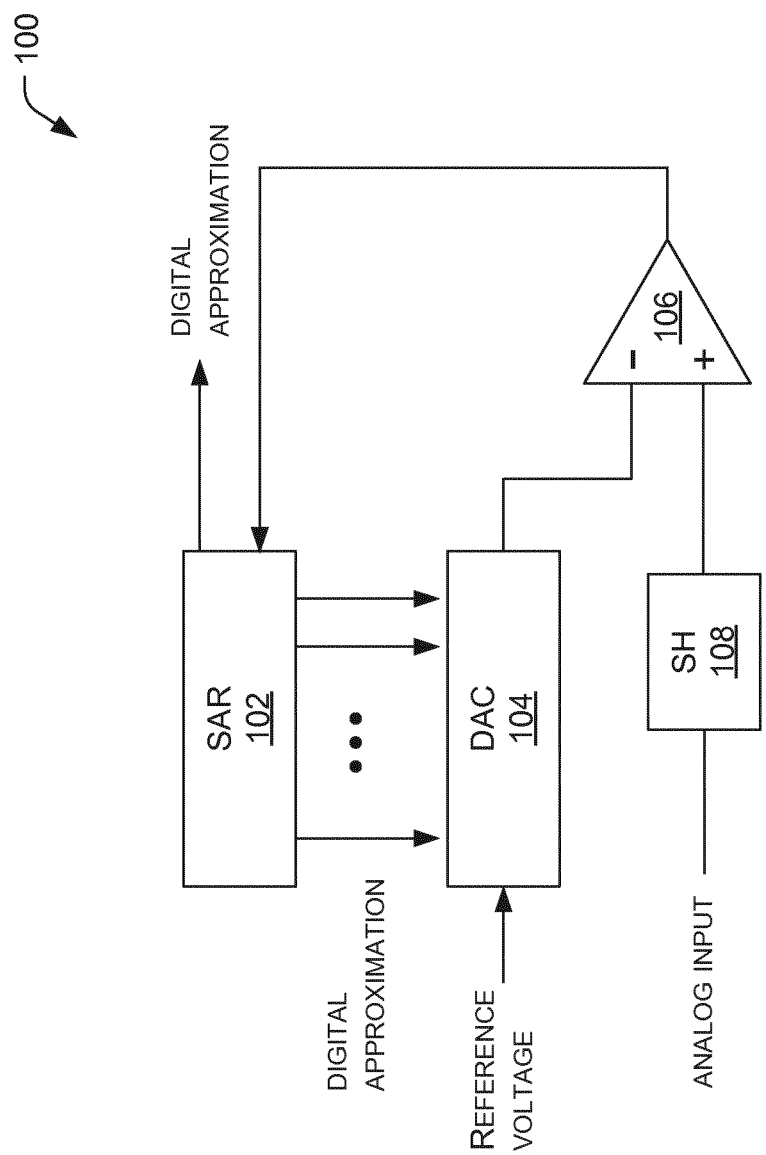
FIG. 1 is a schematic diagram of an example analog-to-digital converter (ADC) wherein the techniques and devices described herein may be applied.

Representative implementations of devices and techniques provide a built-in self-test (BIST) for an analog-todigital converter (ADC). In various implementations, the stimuli needed to test an ADC are generated within the chip containing the ADC. In the implementations, evaluation circuitry is also available on-chip. In an example, generation and evaluation circuits and systems are based on existing circuits and/or components of the chip. In the example, additional circuitry with minimal area overhead is added to the chip to work with the existing components.

In an implementation, a BIST system is integrated with an ADC and reuses the existing resources of the capacitive charge redistribution SAR ADC. In the implementation, an on-chip stimulus signal is generated by multiplexing the existing capacitor array (or a subset of the capacitors) of the ADC to a charging circuit and a discharging circuit (which may comprise the same circuit). In an implementation, the BIST compares the changing signal to a threshold. The threshold crossing times can be used to compute the capacitor array matching and subsequently the transfer curve and static error values (e.g. INL, DNL, etc.).

Due to a functional safety focus, including built-in self-test (BIST) with an ADC, particularly one that takes advantage of existing ADC components, can provide many benefits. In various implementations, the BIST has a number of advantages, including the following: 1) The ADC can be field-tested for specification compliance after production of the ADC, enabling the ADC to be used in safety critical applications; 2) latent faults that arise after a time of usage can be detected by the customer; 3) ageing of the ADC circuitry can be monitored; 4) as no external components are required, the BIST can also be run during the FE test; and 5) as there is no need for external stimuli, the PCB design for the customer can be simplified.

In various examples, the BIST is arranged to conduct a structural and performance test of an ADC during production testing without the use of highly precise stimuli generators. In other examples, the BIST is arranged to conduct an in-system test enabling the customer to check the functionality of the ADC during field operation. Further, the BIST includes the following key elements: repurposing of the ADC circuitry to measure the capacitances of the capacitance array; on-chip measurement of the capacitance array; usage of the measured data to assess function of the ADC during its life time; usage of the measured data to assess the performance of the ADC during its life time; usage of the measured data to check ageing effects of the ADC in the field; usage of the measurement during production test (front-end or back-end); usage of the measurement to assess circuit function before and after burn-in; Built-In-Self-Test of the ADC or parts of it without the need for precision stimuli; usage of the measurement to conform to functional safety requirements in the field as stated above; and the like.

Various implementations and techniques for built-in self-test (BIST) of ADC arrangements are discussed in this disclosure. Techniques and devices are discussed with reference to example analog-to-digital converter (ADC) devices and systems illustrated in the FIGURES. In some cases, charge redistribution successive-approximation ADC (SAR ADC) designs are shown and discussed. However, this is not intended to be limiting, and is for ease of discussion and illustrative convenience. The techniques and devices discussed may be applied to many of various ADC device designs, structures, combinations, and the like (e.g., direct-conversion ADC, flash ADC, ramp-compare ADC, integrating ADC (also referred to as dual-slope or multi-slope ADC), counter-ramp ADC, pipeline ADC, sigma-delta ADC, time interleaved ADC, intermediate FM stage ADC, etc.), and remain within the scope of the disclosure.

Implementations are explained in more detail below using a plurality of examples. Although various implementations and examples are discussed here and below, further implementations and examples may be possible by combining the features and elements of individual implementations and examples.

Example ADC Arrangement

FIG. 1 is a schematic diagram of an example analog-to-digital conversion (ADC) arrangement 100, wherein the techniques and devices described herein may be applied. Analog signals ("analog input") are received on the input side, converted by a quantity of ADC components, and digital results ("digital output," "digital approximation," or "digital representation") are output from the ADC 100.

For the purposes of this disclosure, a digital result may be described as a digital approximation of an analog input. For example, a digital result may include a digital representation that is proportional to the magnitude of the voltage or current of the analog input, at a point in time and/or over a selected duration. The digital representation may be expressed in various ways (e.g., base 2 binary code, binary coded decimal, voltage values, electrical or light pulse attributes, and the like).

As shown in FIG. 1, an example ADC 100 may include a successive approximation register (SAR) component 102, a digital-to-analog converter (DAC) 104, and a comparator 106. In alternate implementations, an example ADC 100 may include fewer, additional, or alternate components. In one example, the ADC 100 is a charge redistribution ADC.

The SAR 102 receives the analog input signal (which may be adjusted based on the output of the DAC 104 via the comparator 106) and determines a digital approximation for the analog input signal. The SAR 102 may output the digital results in a parallel fashion (such as illustrated to the DAC 104), with each bit (of multiple bits based on the resolution of the SAR 102) outputted on an individual path. Also, the SAR 102 may output the digital results in a serial form. Both of these techniques are shown in the illustration of FIG. 1. In various implementations, the output of the SAR 102 is the digital output of the ADC 100.

Resolution of the ADC 100 may be defined based on the minimum voltage level required to cause a change in the output code of the SAR 102. For example, the minimum voltage that causes a change in the digital code is the least significant bit (LSB) of the ADC 100. The resolution of the ADC 100 is the LSB voltage. In various implementations, the SAR 102 may have 8, 10, or 12 bits of resolution, for example. In alternate implementations, the SAR 102 may have fewer or a greater number of bits of resolution.

Configurations and/or arrangements for the SAR 102 and/or the DAC 104 may vary, and are discussed further below. In various implementations, the DAC 104 may be comprised of an array of multiple switched capacitances. Additionally, approximating a digital value for each input signal (and/or converting the digital signal to an analog form within the DAC) may be according to one or more processes or algorithms.

In an example, the DAC 104 receives a digital output of the SAR 102, and converts it to an analog form. As shown in FIG. 1, the DAC 104 can receive the digital output of the SAR 102 via multiple bits, based on the resolution of the SAR 102. Also as shown in FIG. 1, the analog form of the digital output may be fed back, and/or combined with or compared to the analog input signal (e.g., added, subtracted, etc.). The feedback loop of the DAC 104 can provide error correction to the ADC 100, as the analog form of the digital output is compared to the analog input signal, the reference voltage, or another signal.

Figure 4:
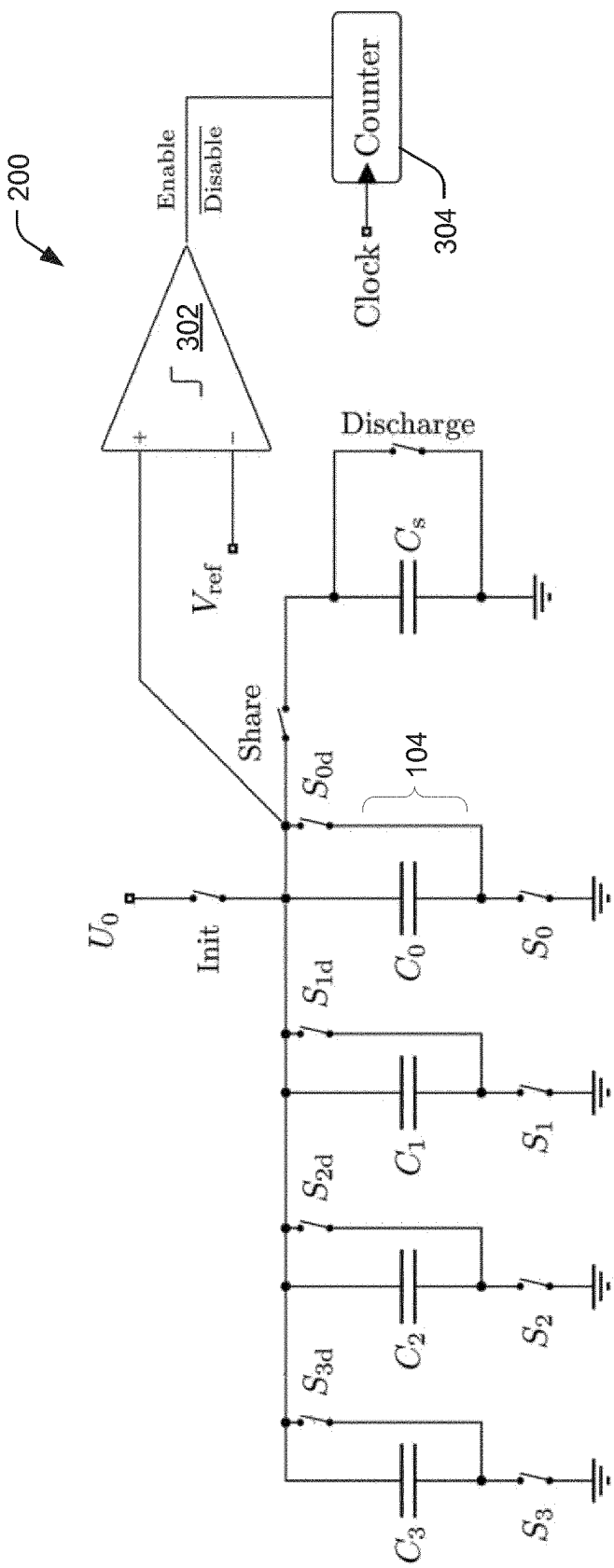
FIG. 4 is a schematic diagram of an example switched capacitor discharger including measurement capability, integrated with a capacitor array of an ADC, according to an implementation.

In an implementation, the DAC 104 comprises an array of multiple switched capacitances. In one example, the DAC 104 array consists of n capacitances. For instance, if a binary-weighted DAC 104 is used (such as shown in FIG. 4), n is equal to the resolution of the ADC 100 in bits. In other words, each of the capacitances of an array 104 can represent a bit position. In some examples, an additional dummy capacitance of the array does not represent a bit position, but is included for functionality of the ADC 100. In alternate implementations, one or more of the capacitances of the array may be implemented using a single component or multiple sub-elements.

For a non-binary-weighted DAC 104 (also within the scope of the disclosure), n may be bigger than the bit-resolution of the ADC 300. In an implementation, coding logic may be used between the SAR 102 and the digital output, to conform the output to an application.

Additionally, the ADC 100 may include one or more sample and hold components (SH) 108. For example, the SH 108 may include a capacitance, one or more capacitances in an array, or the like. The SH 108 can sample the analog input continuously, at predefined discrete moments, or at other desired durations or intervals. The sampled input is digitally approximated using the SAR 102, and is also compared to the analog output of the DAC 104 to maintain an accurate ADC 100 output. In some implementations, one or more capacitances of the DAC 104 may also act as SH components.

In alternate implementations, an ADC 100 may include additional components or alternate components to perform the functions discussed, or for other desired functionality. In further implementations, the functional components or modules of the ADC 100 may be arranged or combined in a different arrangement, form, or configuration.

Example Implementations

Figure 2:
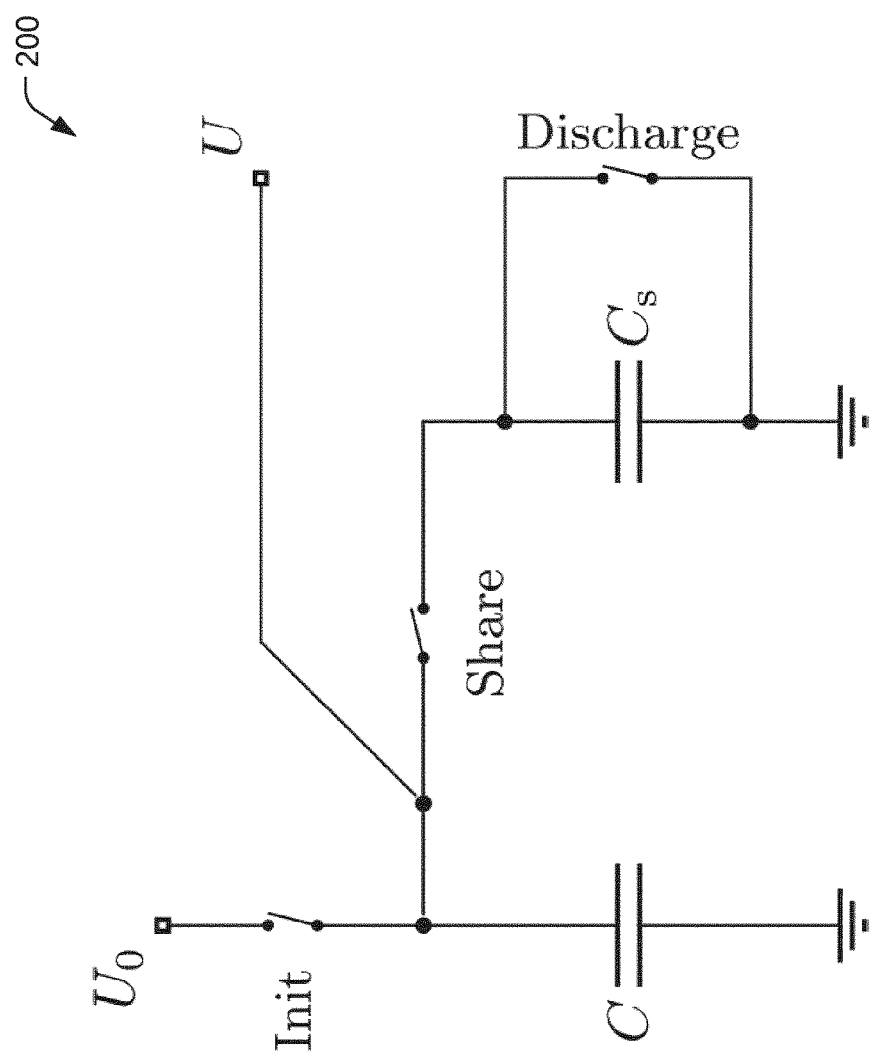
FIG. 2 is a schematic diagram of an example switched capacitor discharger, according to an implementation.

FIG. 2 is a schematic diagram of an example switched capacitor discharger (SCD) 200, according to an implementation. In various implementations, the SCD 200 can be used to measure capacitance of a capacitor array, such as the charge redistribution DAC 104 array of a SAR ADC 100, for example. The SCD 200 illustrates the basic concepts.

In an example, the SCD 200 initially has all switches open. The "init" switch is closed to initialize capacitor C to the voltage Uo. Then, "init" is opened. The switch "discharge" is closed to discharge capacitor Cs. Then, "discharge" is opened. The "share" switch is closed to share charge between both capacitors C and Cs. Then, "share" is opened. The switch "discharge" is again closed to discharge capacitor Cs, and the cycle is repeated iteratively from that step through to opening the switch "share." After the $n^{th}$ discharge cycle:

$$U = U_o \left( \frac{C}{C + C_s} \right)^n$$

Figure 3:
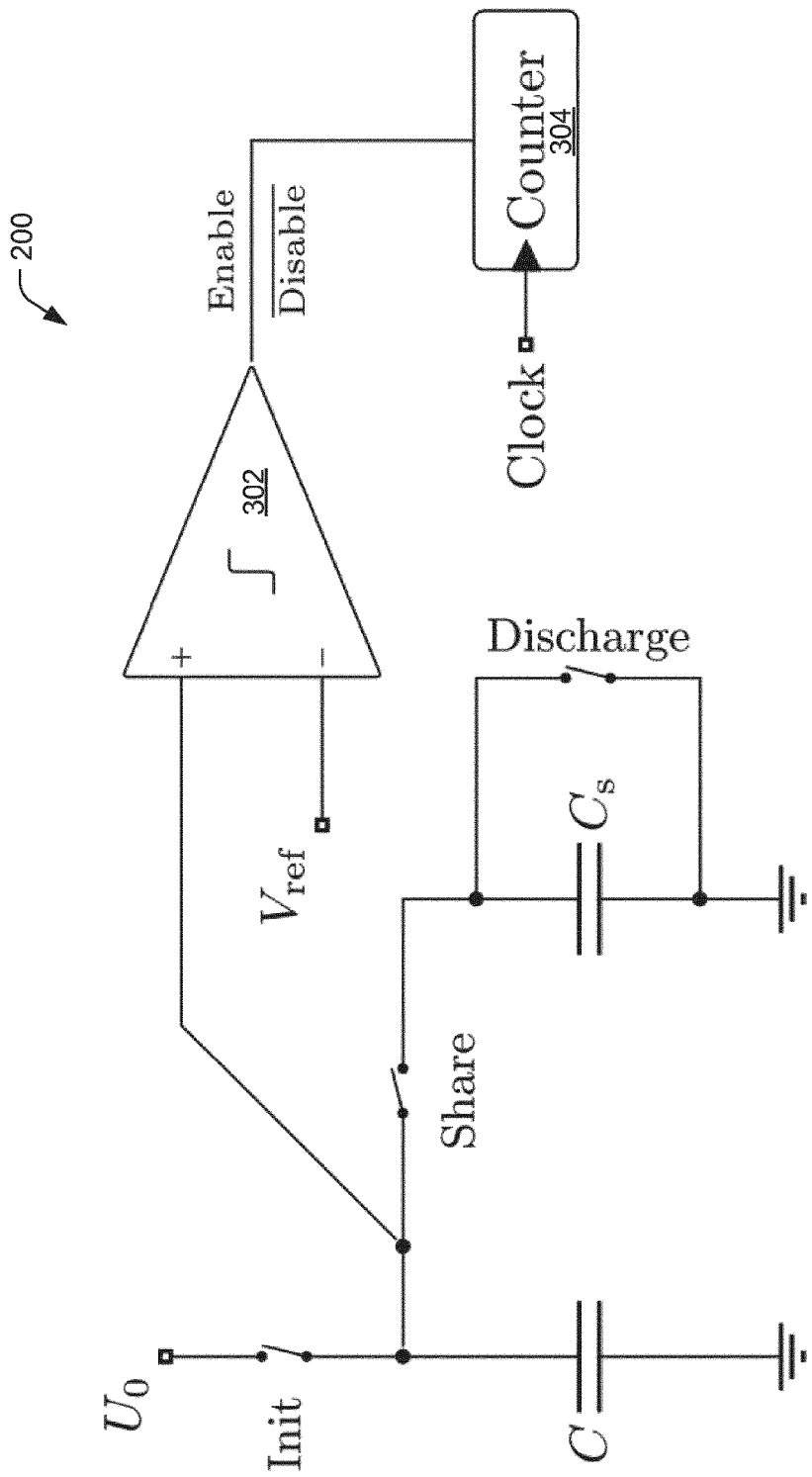
FIG. 3 is a schematic diagram of an example switched capacitor discharger, including measurement capability, according to an implementation.

As shown in FIG. 3, measurement capability can be added to the SCD 200 by including a comparator 302 and a clock counter 304, and by gating the counter 304 with the comparator 302. In an implementation, when the threshold of the comparator 302 is met, the counter 304 is incremented. In one example, the threshold of the comparator 302 is met as the voltage across $C_s$ is reduced (via the iterative charging and discharging described above) to a preset (or dynamic) threshold represented by $V_{ref}$. In an implementation, the counter 304 stores the value of n at which:

$$U_n = U_o \left( \frac{C}{C + C_s} \right)^n = V_{ref} + V_{offs}$$

where $V_{ref}$ is the reference voltage and $V_{offs}$ equals the voltage offset of the comparator 302.

In another implementation, the capacitor C of the SCD 200 can be replaced with a capacitor array (such as the DAC 104 array, for example) of the ADC 100. This is illustrated in FIG. 4, using a 3 bit ADC as an example. Doing so integrates the SCD 200 with the ADC 100, and allows the SCD 200 to test the capacitances (of the capacitor array 104, for example) of the ADC 100.

Referring to FIG. 4, by switching $S_i$ and $S_{id}$ accordingly, a capacitance $C_i$ can either be included into or excluded from the capacitance of the array 104. In an example, the bottom plate parasitics of each capacitor ($C_0$ to $C_3$) is connected to the measured capacitance when the associated switch $S_{id}$ is closed. For example, when all capacitances ($C_0$ to $C_3$) are included and measured, the equation becomes:

$$U_o \left( \frac{C_g}{C_g + C_s} \right)^{na} = V_{ref} + V_{offs}$$

and when capacitor $C_0$ is excluded, the equation becomes:

$$U_o \left( \frac{C_g - C_0}{C_g - C_0 + C_s} \right)^{n0} = V_{ref} + V_{offs}$$

and when capacitor $C_1$ is excluded, the equation becomes:

$$U_o \left( \frac{C_g - C_1}{C_g - C_1 + C_s} \right)^{n1} = V_{ref} + V_{offs}$$

and so forth. Accordingly, 5 equations with 4 unknown capacitances result from excluding each of the 4 capacitances ($C_0$ to $C_3$) one at a time. These equations can be solved and simplified to get a feasible measurement (e.g., a direct solution) of the capacitances of the capacitors comprising the capacitance of the array 104, including any linearization error based on capacitor mismatch (which is discussed further below):

$$C_i \approx \frac{n_a - n_i}{n_a} C_g$$

where the error can be expressed as (percentage):

$$x = \frac{C_s}{C_g - C_i}.$$

Accordingly, the smaller $$\frac{C_s}{C_g - C_i}$$

is, the smaller the error of a measurement. However, error can propagate when calculating the capacitor Cs value: the tradeoff being accuracy vs. measurement time.

Figure 5:
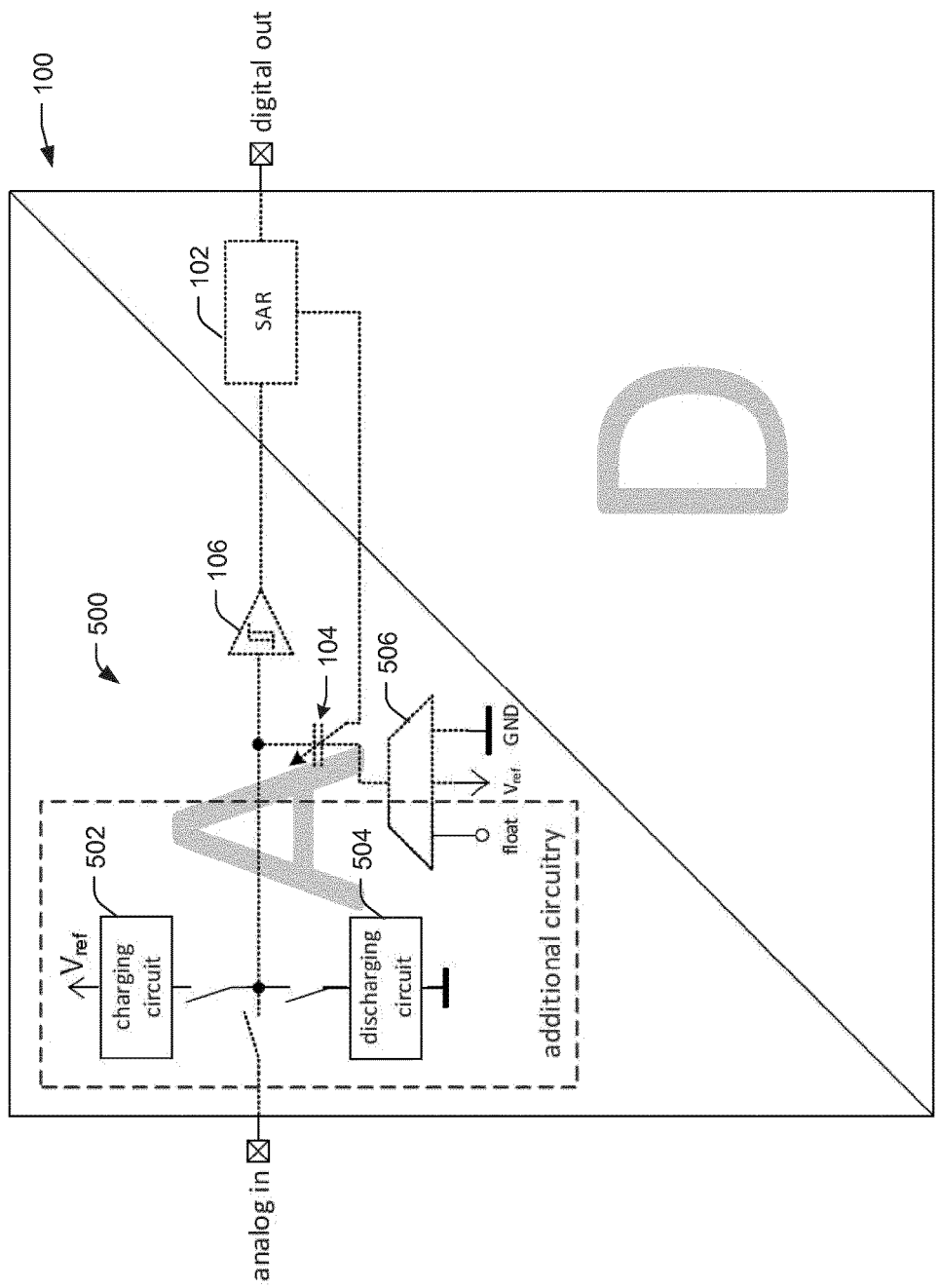
FIG. 5 is a block diagram of an example built-in test arrangement, using some existing ADC components, according to an implementation.

FIG. 5 is a generic block diagram of an example built-in self-test arrangement (BIST) 500, integrated with an ADC 100 and using some existing ADC 100 components, according to an implementation. In the implementation, the BIST 500 includes a SCD 200, or the like, to discharge switched capacitors 104 of the ADC 100. For example, in some implementations, the SCD 200 is included as part of the charging circuit 502 and/or the discharging circuit 504 of the BIST 500.

In an implementation, the BIST 500 comprises existing components of the ADC 100, along with additional circuitry. For example, the existing components include a capacitor array 104 of the ADC 100 and some of the switching of the ADC 100. In an implementation, the additional circuitry includes the charging circuit 502, the discharging circuit 504, and circuitry 506 to let bottom plates of selected capacitors float at preselected times. In an implementation, as shown in FIG. 5, the circuitry 506 to let the bottom plates float is arranged to act as a multiplexer.

In various implementations, the charging circuit 502 and the discharging circuit 504 may be comprised of various different components and/or circuits. Some non-limiting examples are discussed herein. Included are resistive and capacitive examples, which use existing and/or added switching and/or control. However, many other possible charging and discharging arrangements are possible as the charging circuit 502 and the discharging circuit 504.

One example includes the use of one or more current sources to obtain a linear voltage curve. The obtained threshold crossing times can then be directly proportional to the capacitor weights. It is desirable that a current source be highly linear, but not necessarily over the whole voltage range (e.g. only from 0 to MSB). It is also desirable that the current be very low in order to reach a realistic number of discharge cycles until a threshold is crossed. In alternate implementations, more sophisticated techniques to obtain a linear charge or discharge curve of the capacitor array 104 are also possible.

Figure 6:
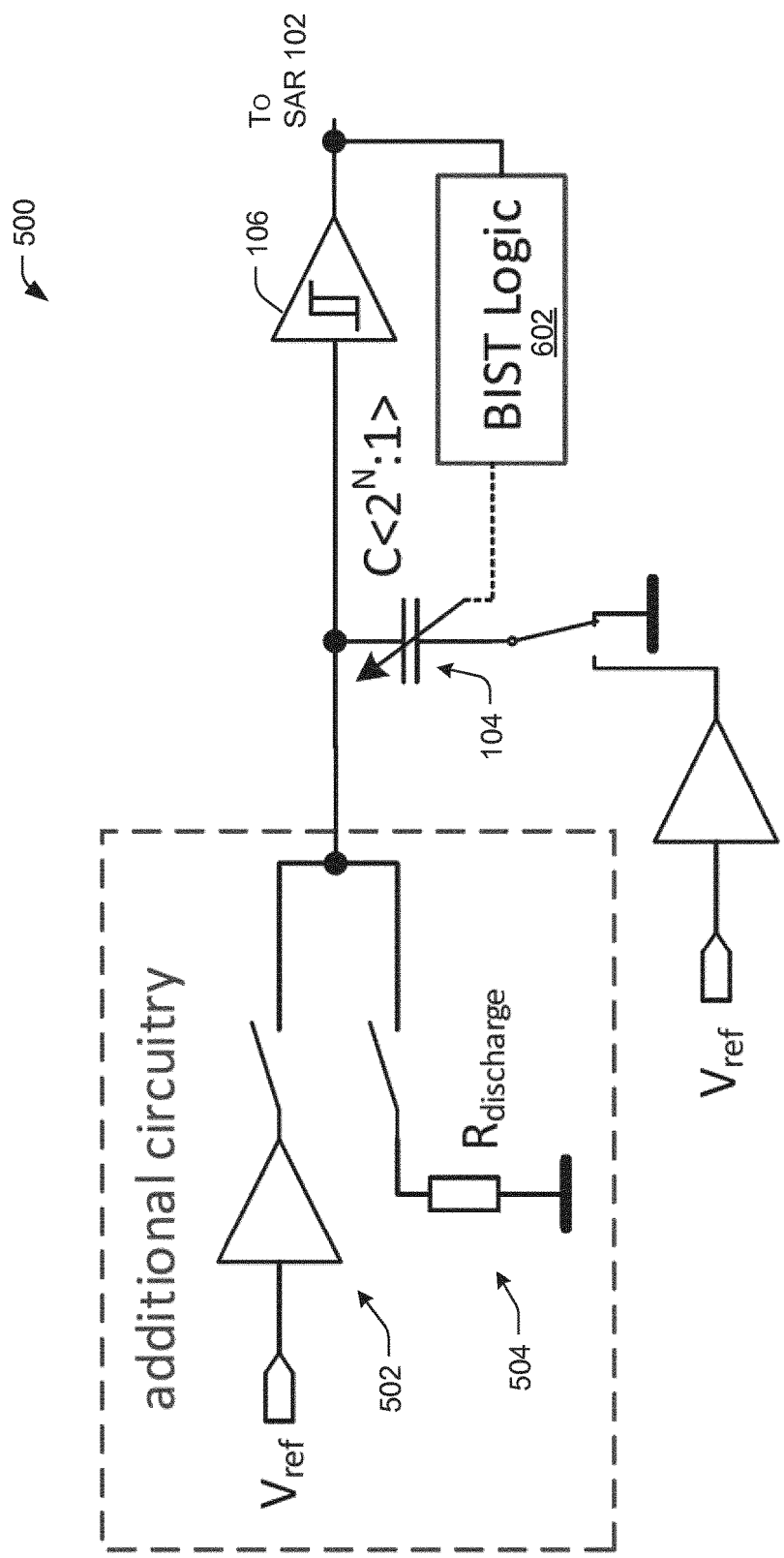
FIG. 6 is a schematic diagram of an example built-in test arrangement, according to an implementation.

FIG. 6 is a schematic diagram of an example BIST 500, according to an implementation. As shown in FIG. 6, the BIST 500 includes much of what is included on the analog side (e.g., left side) of the block diagram of FIG. 5, plus additional detail of example components, and the inclusion of BIST logic 602. In an implementation, the BIST logic 602 provides control to the BIST 500, and may include the comparator 302 and the counter 304. In various implementations, the comparator 302 comprises the comparator 106 of the ADC 100.

The example discharge circuit 504 of FIG. 6 is illustrated as a resistive discharge circuit (e.g., $R_{discharge}$). This is one type of example discharge circuit, and other types may also be used, including a capacitive discharge circuit, as discussed further below.

Depending on the charging and discharging techniques and circuits, as well as the configuration of the capacitor multiplexers 506, different algorithms can be used to measure the capacitor array 104 values. In the implementations discussed and illustrated in the FIGURES the initial charging of the capacitors 104 happens via the feedback path of the comparator 106, but other charging configuration can be also be used.

In an implementation, the BIST 500 charges the capacitor array 104 to a certain voltage, and then discharges it until a threshold, which may be variable, is reached. The time or number of clock events elapsed until the comparator 106 reacts is measured and used to compute the capacitor array 104 values or their ratios. The time measurement can be conducted either by direct time measurement or by counting the number of clock events.

For convenience of discussion, techniques used by the built-in self-test 500 have been split into three sections which deal with example stimulus generation, example threshold setting, and example algorithms for evaluating the results.

Example Stimulus Generation

In an implementation, the BIST 500 generates a stimulus which enables measuring the relevant values of the capacitor array 104, and without explicitly having to sample the stimulus signal. In an example, stimulus generating includes charging and discharging one or more of the multiple switched capacitances of the capacitor array 104. For example, this may be performed iteratively, as discussed above.

Figure 7:
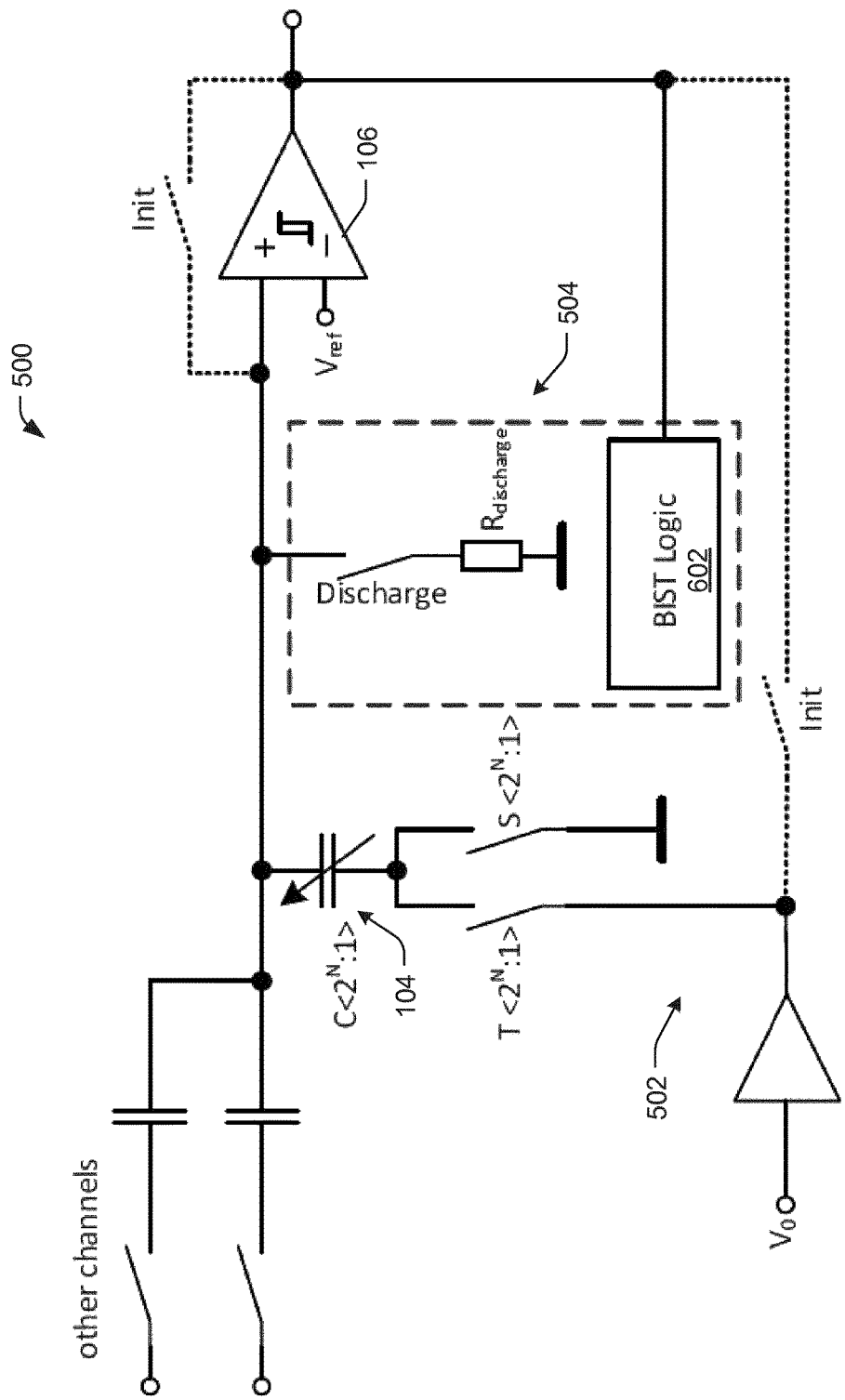
FIG. 7 is a schematic diagram of an example stimulus generation arrangement using resistance, integrated with an ADC arrangement, according to an implementation.
Figure 8:
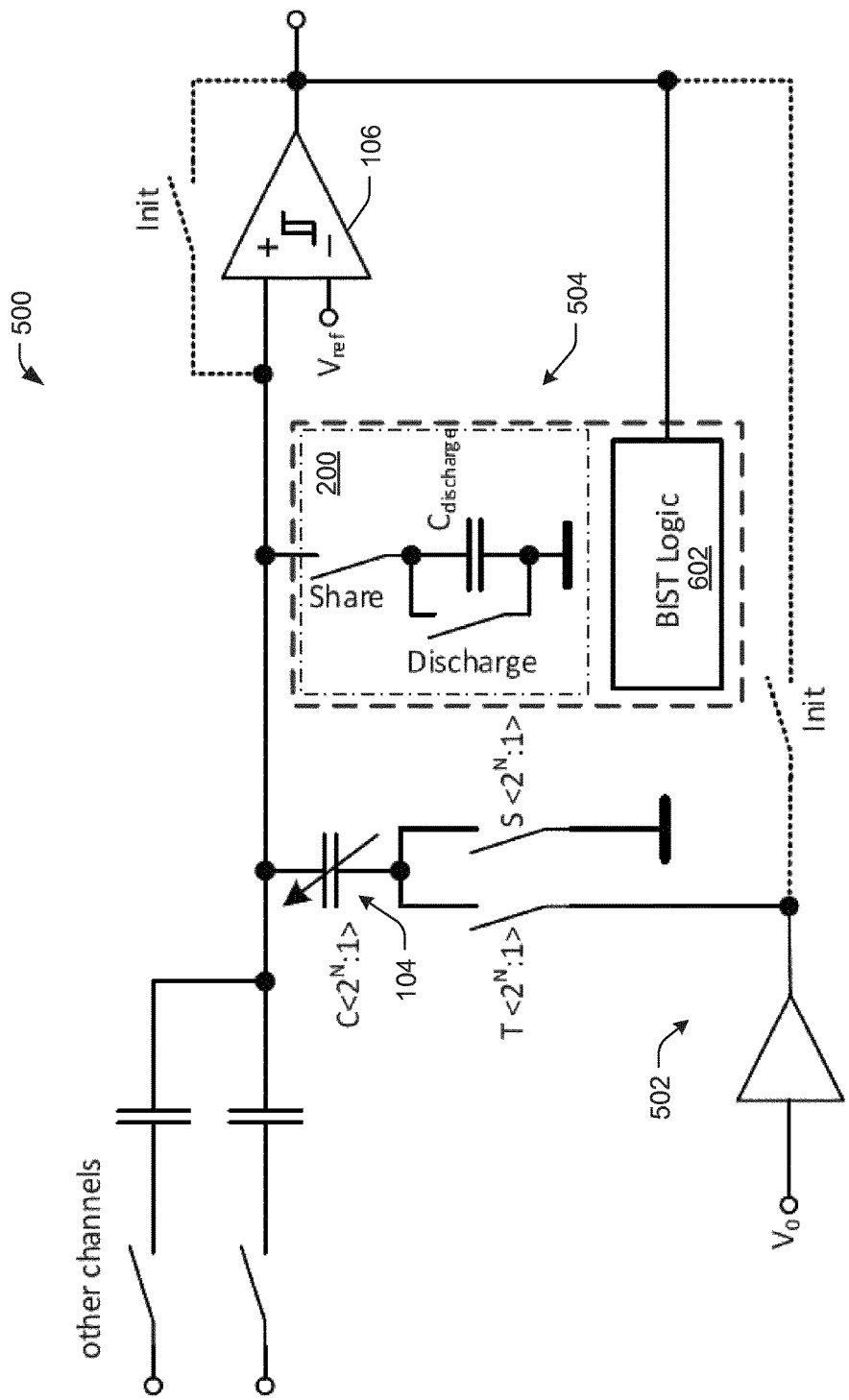
FIG. 8 is a schematic diagram of an example stimulus generation arrangement using capacitance, integrated with an ADC arrangement, according to an implementation.

In alternate implementations, the discharging can be performed by an ohmic resistor circuit 504 (as shown in FIG. 7, for example) as well as by a switched capacitor circuit 504 (as shown by the SCD 200 in FIG. 8, for example). In either case, the resulting stimulus signal is exponentially decaying. In various implementations, the choice of one type of discharge circuit 504 over another depends on the desired discharging speed and on the capacitance of the capacitor array 104. In some cases, the switched capacitor circuit 504 requires less silicon area than the equivalent ohmic resistor circuit 504.

In an implementation (referring to FIGS. 7 and 8), the stimulus signal is generated as follows:

Connect the bottom plate switches of the desired capacitors of the array 104 to ground, and the remaining capacitors of the array 104 are floating for the whole measurement procedure.

Charge the capacitor array 104 to the reference voltage (in this example, via the feedback path of the comparator 106, shown as a dashed in FIGS. 7 and 8).

Connect the discharging element (e.g., the resistor circuit 504 of FIG. 7 or the capacitor circuit 504 of FIG. 8) to the capacitor array 104 for one clock cycle.

Perform a threshold comparison at the comparator 106 according to one of the comparator threshold algorithms described below.

Iteratively continue to connect the discharging element (e.g., the resistor circuit 504 of FIG. 7 or the capacitor circuit 504 of FIG. 8) to the capacitor array 104 for one clock cycle, and perform a threshold comparison at the comparator 106, the until the algorithm is finished.

Alternatively, the stimulus signal could also be an exponentially increasing signal if the discharging element was exchanged with the charging element. The algorithms described below would be adapted accordingly (e.g., the capacitor array 104 would be incrementally charged each clock cycle, etc.), but the inherent procedure would remain unchanged.

In an implementation, if a clock with a counter 304 is used to measure the time intervals, a higher number of hits (i.e. for how many clock periods the discharging method must be activated in order to reach the threshold) can be used in order to increase the measurement accuracy.

Example Comparator Threshold Setting

In one implementation, the comparator 106 of the BIST 500 may be set with a static threshold. Referring to FIG. 8, a counter 304 contained in the BIST Logic 602 is initially set to zero. The switches labelled "Init" are closed, charging the capacitance 104 to the Voltage $V_0$, and then the switches "Init" are opened. The capacitance $C_{discharge}$ is discharged through the switch "Discharge", which is opened afterwards. Then, the discharged $C_{discharge}$ capacitance is switched, through the switch "Share," in parallel to the capacitance 104, thereby lowering its voltage to $$V_1 = V_0 \frac{C}{C + C_{discharge}}.$$

The switch "Share" is then opened, the counter 304 is incremented, and a new discharge cycle for $C_{discharge}$ begins. This procedure is repeated as long as the output of the comparator 106 is high. When the voltage of the capacitor 104 reaches the comparator 106 threshold, the comparator 106 switches its state and stops the counter 304.

In the implementation, the counter 304 now contains the number n of cycles needed to discharge the capacitor 104 from the initial voltage down to the comparator's threshold.

Figure 9:
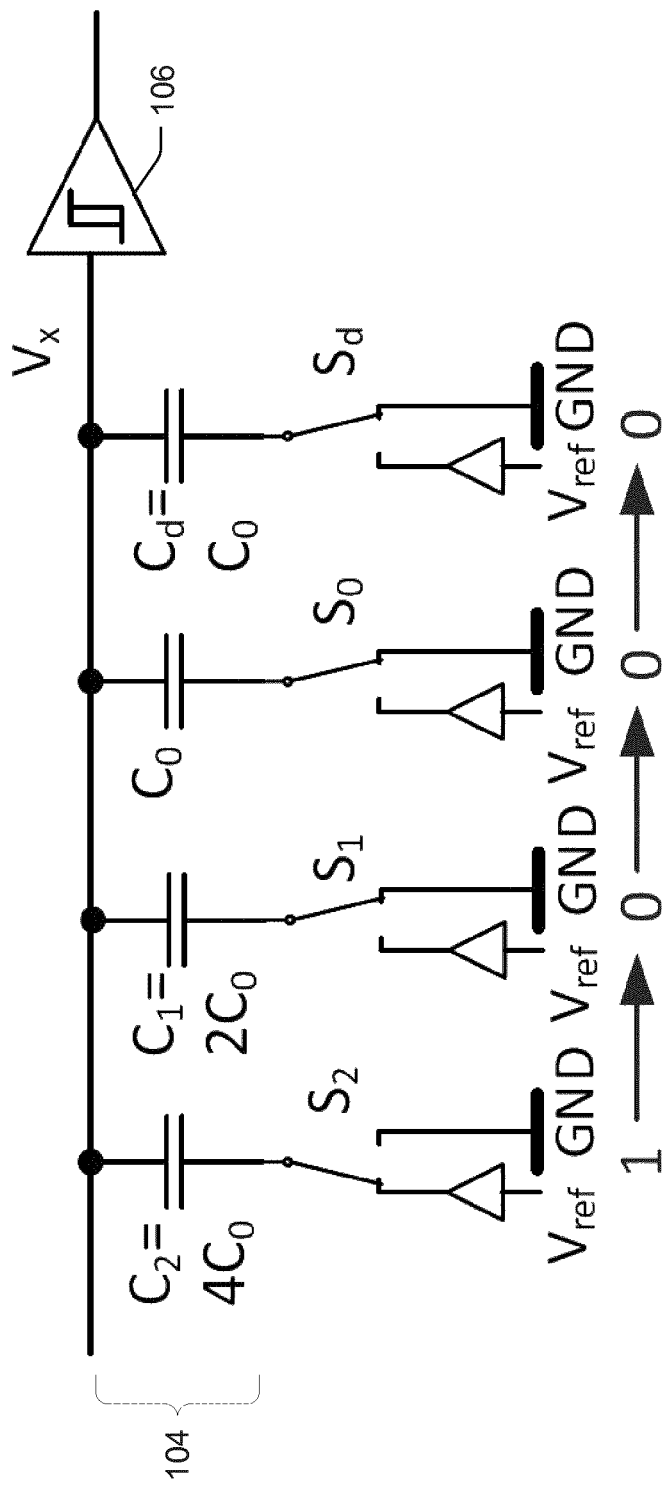
FIG. 9 is a schematic diagram of an example adaptation of a comparator threshold for a stimulus generation arrangement, according to an implementation.

In another implementation, the comparator 106 of the BIST 500 may be set with a dynamic threshold. Referring to FIG. 9, the dynamic adaptation of the threshold allows the capacitor array 104 to be characterized within one discharging cycle. The adaptive threshold for the BIST 500 is determined by setting the capacitor array 104 capacitors' bottom plate switches ($S_0$-$S_2$, $S_d$). If a switch is set to 1, the threshold voltage of the comparator 106 is increased by the ratio of the respective capacitor value to the total active capacitance (floating capacitors excluded) of the array 104. The bit weights are defined by the ratio of the bit capacitance to the total active capacitance. Therefore, the capacitor array 104 can be characterized by measuring the thresholds of each bit successively.

As shown in FIG. 9, for an exponentially discharging stimulus, the first threshold is determined by the MSB, while the other bits are set to 0. Once the threshold is reached, the next highest bit is set to 1, while the others are set to 0. This continues, and is equivalent to a shift register that shifts in zeros from the left side. This results in an exponentially lowered threshold.

Alternately, for an exponential charging curve, the process is the same, but instead of zeros the shift register shifts in ones. In various implementations, more patterns are also possible. In the implementations, the condition is that the patterns lead to an equation system which can be solved for the intended information.

In an implementation, the times (in clock cycles) when the thresholds are crossed are recorded and subsequently analyzed in the next step. The dummy capacitor's ($C_d$) threshold crossing time is measured in parallel with the LSB ($C_0$), as the corresponding weight is ideally the same as the weight of the LSB. In another implementation, the comparator 106 output is filtered to cancel the effects of noise on the threshold crossing times.

Figure 10:
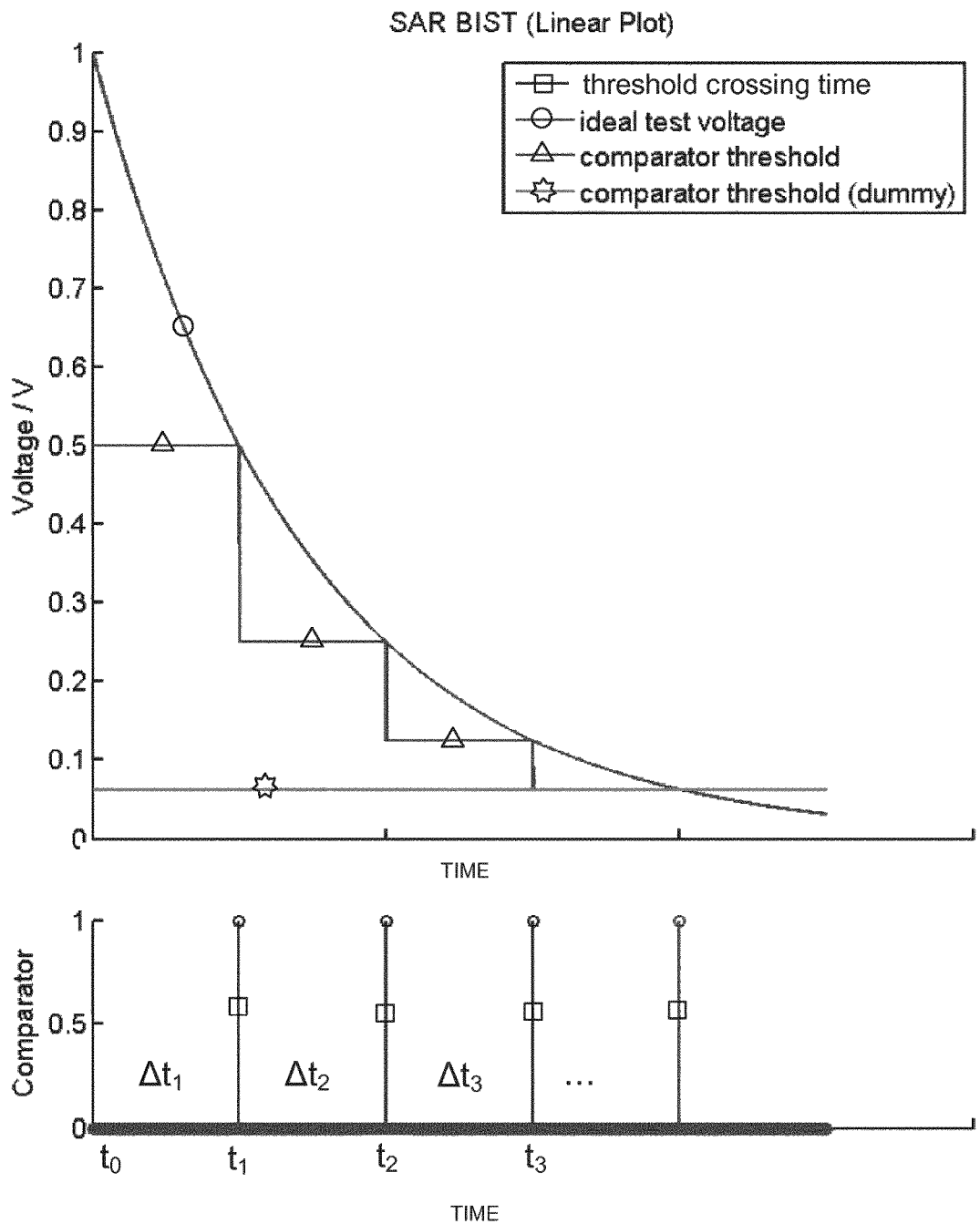
FIG. 10 is a diagram showing threshold lowering after threshold crossings and threshold crossing times of an example built-in self-test arrangement, according to an implementation.
Figure 11:
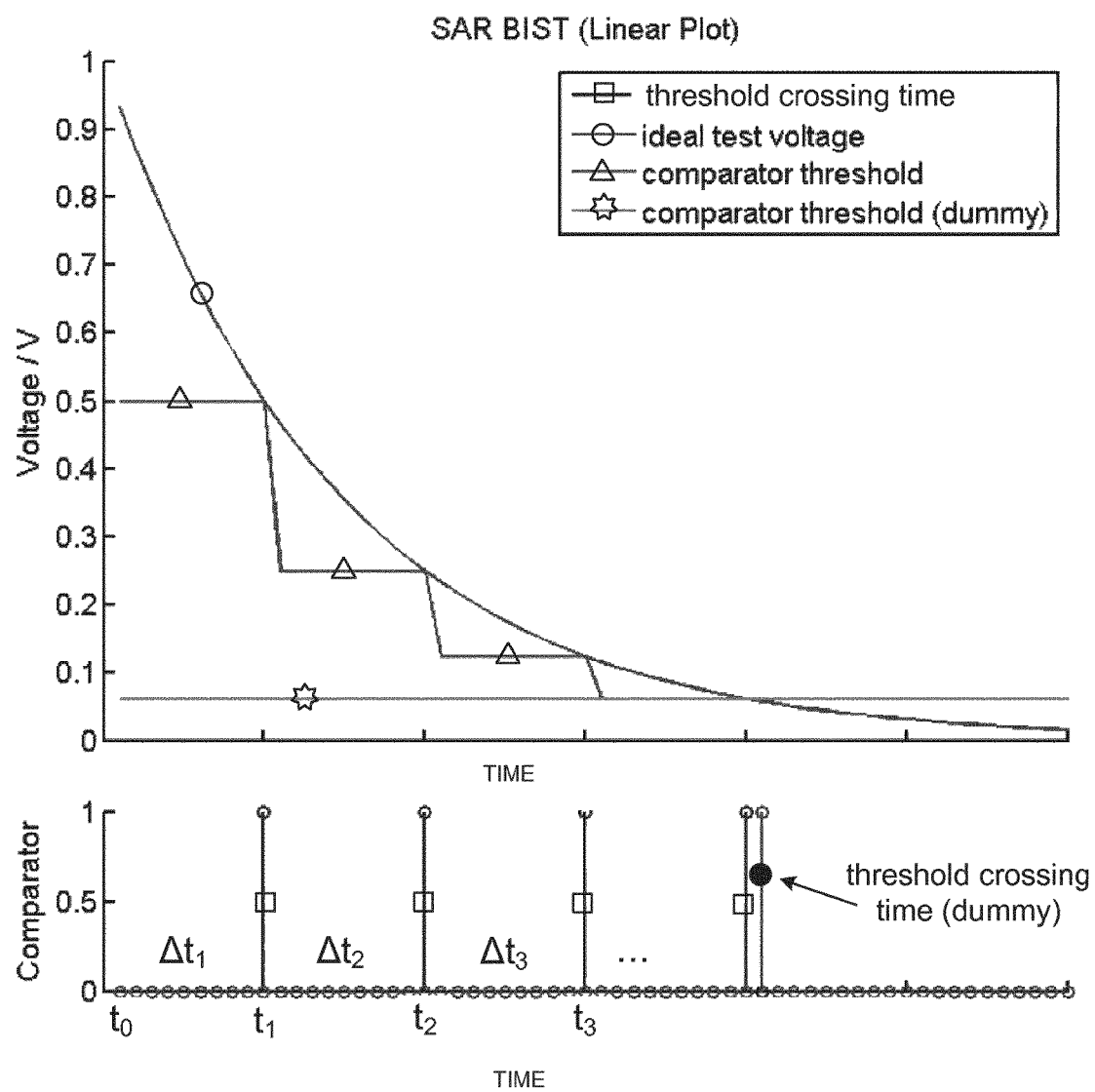
FIGS. 11 and 12 are diagrams showing threshold crossing times for an example 3-bit ADC without capacitor mismatch (FIG. 11) and with capacitor mismatch (FIG. 12), according to an implementation.

For example, FIG. 10 is a diagram showing example dynamic threshold lowering after threshold crossings and example threshold crossing times of a BIST 500, according to an implementation. In the diagram of FIG. 10, the comparator 106 thresholds are shown in an exponentially decaying curve. In alternate implementations, the comparator 106 thresholds may be an exponentially increasing curve, or other pattern as mentioned above. FIG. 11 is similar to FIG. 10, where the difference between these figures is the number of hits per weight in each figure.

Example Algorithms for Evaluation of Results

In various implementations, different algorithms may be used to evaluate the measured results of stimulus generation, including charging and discharging the capacitor array 104, and of measuring the results of applying the stimulus to static and dynamic thresholds. In the implementations, the capacitance values of the capacitor array 104 can be determined (e.g., computed, deduced, etc.) based on characterizing the capacitances with the following techniques. The described evaluation techniques are illustrated and described based on the exponentially decaying stimulus signal described above. In alternate implementations, the techniques can be adapted to other stimulus signals as well.

In an implementation, the capacitor array 104 can be characterized based on a static threshold, as described above, for example. The functional relationship in this case can be expressed as:

$$U_n = U_o \left( \frac{C}{C + C_s} \right)^n = V_{ref} + V_{offs}$$

where $V_{offs}$ is the comparator offset, and the capacitance C represents the capacitor array 104 under test. The principle is not restricted to discharging the capacitance C, and the same procedure can be applied to a charging process as well. For example, this would also lead to measurements that would allow the BIST 500 (or an ATE, for instance) to compute the capacitors' values.

Referring to FIGS. 3, 4, and 8, an example BIST 500 may be integrated with a 3-bit ADC 100, for example. This example will be used to illustrate a measurement technique, but it is not intended to be limiting, nor restricted to an ADC 100 with 3 bits. The technique may be extended to ADCs 100 having any number of bits.

In the example of a measurement technique, the capacitance C described herein can represent the capacitor C of FIG. 3 or the capacitance array 104 of FIGS. 4 and 8. In this case (with a 3-bit ADC 100, and referring to FIG. 4), and in this example, at least five independent measurements are possible, as described above.

1. All switches $S_0$, $S_1$, $S_2$, $S_3$ closed, resulting in counter 304 value $n_a$
2. $S_0$ open, all others closed, resulting in counter 304 value $n_0$
3. $S_1$ open, all others closed, resulting in counter 304 value $n_1$
4. $S_2$ open, all others closed, resulting in counter 304 value $n_2$
5. $S_3$ open, all others closed, resulting in counter 304 value $n_3$ Other equation systems are also possible. With the effect, that when more measurements are made, one can use available mathematic methods to determine the capacitance ratios.

As shown, for m capacitances, m+1 measurements can be made. With these m+1 measurements, the capacitance values can now be calculated.

With $C_g = \Sigma_{i=0}^{m-1} C_i$, the measurement with all switches closed results in:

$$U_o \left( \frac{C_g}{C_g + C_s} \right)^{n_a} = V_{ref} + V_{offs}$$

Any measurement with a capacitance $C_i$ left out of the capacitance array 104 results in:

$$U_o \left( \frac{C_g - C_i}{C_g - C_i + C_s} \right)^{n_i} = V_{ref} + V_{offs}$$

If each of these measurement results is equated to the result of the measurement with all switches closed, we get:

$$\left( \frac{C_g - C_i}{C_g - C_i + C_s} \right)^{n_i} = \left( \frac{C_g}{C_g + C_s} \right)^{n_a}$$

Note that the values of the threshold voltage "$V_{ref}$," the value of the initial voltage "$U_o$," and the offset "$V_{offs}$" of the comparator 106 get cancelled, e.g. they are of no primary importance to the measurement. The above equation is also true for the inverse of the arguments to the power function, which results in:

$$\left( \frac{C_g - C_i + C_s}{C_g - C_i} \right)^{n_i} = \left( \frac{C_g + C_s}{C_g} \right)^{n_a}$$

Which is equivalent to:

$$\left( 1 + \frac{C_s}{C_g - C_i} \right)^{n_i} = \left( 1 + \frac{C_s}{C_g} \right)^{n_a}$$

As this can be done for each capacitance from the array 104, the result is a non-linear equation system that can be solved to obtain the capacitance values. This can also be simplified as follows: Assuming that $C_s \ll C_i$, the power terms can be approximated as follows:

$$1 + n_i \frac{C_s}{C_g - C_i} \approx 1 + n_a \frac{C_s}{C_g}$$

when solved for the individual $C_i$, yields (as discussed above):

$$C_i \approx \frac{n_a - n_i}{n_a} C_g$$

All individual capacitance values that influence the conversion result are now known. The ratio $C_i/C_g$ representing the weight of bit i of the ADC 100 is available numerically.

In another implementation, the capacitor array 104 can also be characterized based on a dynamic threshold, as described above, for example. This example technique allows measuring and calculating the bit weights accurately (depending on the chosen number of hits per weight). The necessary calculations can be carried out either on the ATE or on a processing unit on the chip, for example. The choice depends on the intended use of the BIST 500.

In an implementation, the algorithm includes the following steps:
Perform the stimulus generation with all capacitors of the array 104 enabled (no floating bottom plates).
Measure all threshold crossing times $t_i$ according to the dynamic threshold adaptation described above, for example (for clock counting: $t_i = n_i \cdot T$), where T is the clock period.
Equation: Sum of all weights (including the dummy capacitor) equals one, where a weight is defined as the ratio of the capacitance $$w_i = \frac{C_i}{\sum_i C_i} :$$

$f(\tau) = \sum_{i=1}^{N} e^{-t_i/\tau} + e^{-t_d/\tau} - 1 \stackrel{\text{def}}{=} 0$, where $\tau$ is defined as a time constant of the charge/discharge network.
Solve the nonlinear equation for the time constant $\tau$
Calculate weights based on the time constant and the respective threshold crossing time of each bit:
$w_i = e^{-t_i/\tau}$
Based on the obtained weights, the transfer curve, differential nonlinearity (DNL), and integral nonlinearity (INL) can be calculated.

In a further implementation, a technique can be employed to check if all active components of the ADC 100 (e.g., switches, comparator 106, buffer, etc.) are working correctly. Additionally, the technique can check if the matching of the capacitances of the capacitor array 104 is within acceptable limits. In one example, the actual weights of the capacitances are not calculated, but the ratio between successive weights is estimated.

Figure 12:
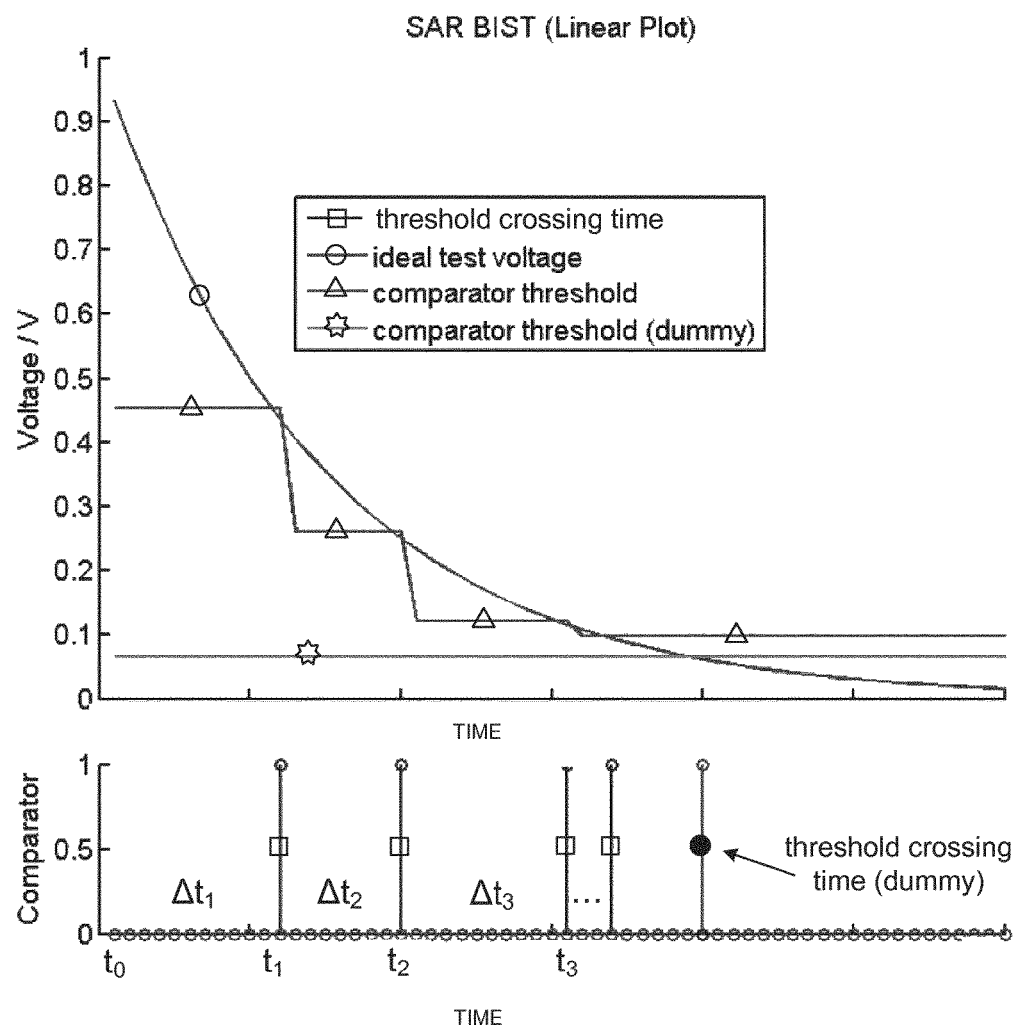

In the implementation, the algorithm includes the following steps:
Perform the stimulus generation with all capacitors of the array 104 enabled (no floating bottom plates).
Measure all threshold crossing times $t_i$ according to the dynamic threshold adaptation described above, for example (for clock counting: $t_i = n_i \cdot T$).
Calculate the time differences between each pair of successive threshold crossing times:
$\Delta t_i = t_i - t_{i-1}$ (e.g., as shown in FIGS. 10-12.)
For perfect matching, the respective time differences $\Delta t_i$ are equal.
If the time differences deviate by more than a configurable limit, either the capacitor array 104 is mismatched or some active parts are not working correctly.
For constant absolute errors, the allowed deviation limit should increase exponentially towards the LSB.
For binary capacitance ratios, the following formula bounds the relative mismatch between successive weights in the array based on the differences between successive threshold crossing times:

$$\left| \frac{\Delta t_{j+1} - \Delta t_j}{\Delta t_j} \right| < \varepsilon_j \Leftrightarrow \frac{w_j}{w_{j+1}} \in [2 - \varepsilon_j \cdot \ln(4), 2 + \varepsilon_j \cdot \ln(4)]$$

The dummy capacitor should be treated the same way as the LSB capacitor is treated.
FIGS. 11 and 12 are diagrams showing threshold crossing times for the example 3-bit ADC 100 without capacitor mismatch (FIG. 11) and with capacitor mismatch or improper functioning of components (FIG. 12), according to an implementation. As shown in FIG. 12, the time intervals between threshold crossings are not equal. This is an indicator of potential capacitor mismatch in the array 104 or of improper functioning of other active components.

As discussed above, the techniques, components, and devices described herein with respect to the implementations are not limited to the illustration in FIGS. 1-12, and may be applied to other ADC 100, SCD 200, and BIST 500 devices and designs without departing from the scope of the disclosure. In some cases, additional or alternative components may be used to implement the techniques described herein. Further, the components may be arranged and/or combined in various combinations, while resulting in a digital output. It is to be understood that an ADC 100 with BIST 500 may be implemented as a stand-alone device or as part of another system (e.g., integrated with other components, systems, etc.).

In various implementations, additional or alternative components may be used to accomplish the disclosed techniques and arrangements.

Representative Process

Figure 13:
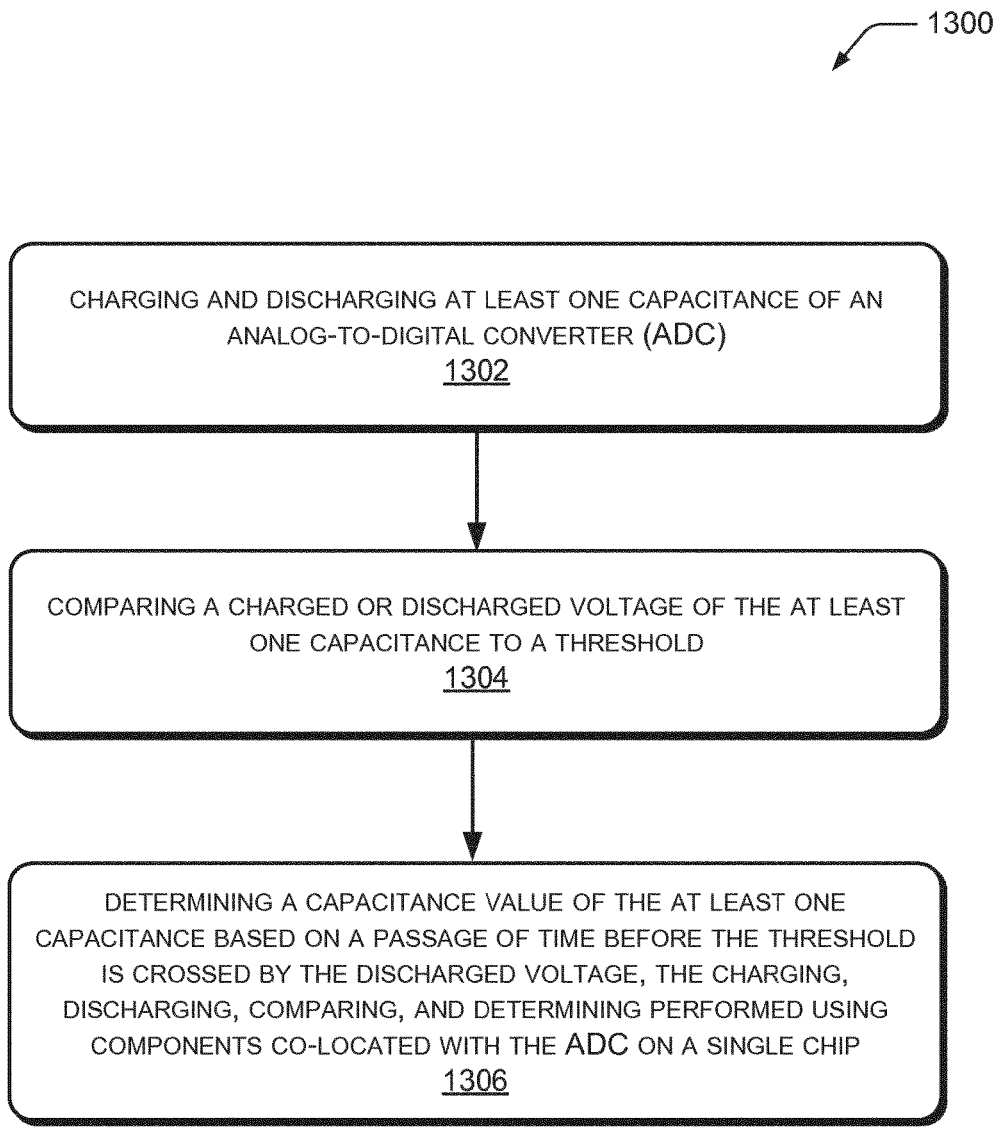
FIG. 13 is a flow diagram illustrating an example process for built-in self-testing an analog-to-digital converter (ADC), according to an implementation.

FIG. 13 is a flow diagram illustrating an example process 1300 for providing a built-in self-test (BIST) (such as BIST 500, for example) for an ADC (such as ADC 100, for example), according to an implementation. The process 1300 describes using existing components of the ADC as well as some additional components to comprise the BIST. For instance, the process includes integrating the BIST with the ADC on a single chip. The process 1300 is described with reference to FIGS. 1-12.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

In an implementation, the process includes generating a test stimulus signal for testing the ADC using components co-located with the ADC on the single chip and components of the ADC located on the single chip. In one example, the process includes generating the test stimulus signal without sampling the test stimulus signal. For instance, the test stimulus signal is produced for use by the BIST without having to sample the signal to determine whether it is suitable for use.

At block 1302, the process includes charging and discharging at least one capacitance of an analog-to-digital converter (ADC). In an implementation, the charging and discharging are included in generating the stimulus signal. In one example, the charging and/or discharging are performed using an exponential waveform. In other examples, other waveforms are used for charging and/or discharging the at least one capacitance.

In an implementation, the process includes multiplexing at least a portion of a capacitor array of the ADC into a charging circuit and a discharging circuit of a built-in self-test (BIST) arrangement. In the implementation, the process includes forming the BIST to co-use some existing components of the ADC, along with the ADC.

In an implementation, the process includes evaluating a result of applying the test stimulus signal to test the ADC using components co-located with the ADC on the single chip. For instance, the evaluating components may be a portion of the BIST.

At block 1304, the process includes comparing a charged or discharged voltage of at least one capacitance to a threshold. In alternate implementations, the comparison is made to a static threshold or an adaptive dynamic threshold. In an implementation, the process includes updating a voltage of the threshold when the charged or discharged voltage crosses the threshold. In some implementations, the threshold is adjusted lower (e.g., forming an exponentially decaying curve) and in other implementations, the threshold is adjusted higher (in the case of an increasing charge on at least one capacitance).

At block 1306, the process includes determining a capacitance value of at least one capacitance based on a passage of time before the threshold is crossed by the discharged voltage. In the implementation, the charging, discharging, comparing, and determining is performed using components co-located with the ADC on a single chip.

In an implementation, the process includes determining the capacitance value of the at least one capacitance based on a quantity of iterations of charging, discharging, and comparing until the discharged voltage crosses the threshold. For example, in one implementation, determining the passage of time is based on a clocked counter gated by a comparator arranged to perform the comparing. In the implementation, counts of the counter are translated to a duration of time.

In an implementation, the process includes performing the generating and evaluating in the field to determine specification compliance of the ADC and/or to determine effects of aging on components of the ADC. In another implementation, the process includes testing the ADC to determine capacitor array capacitance matching, transfer curve, and/or static error values, based on the charging, discharging, comparing, and determining (which may be performed during production testing, while applied in the field, or the like).

In an implementation, the process includes the following procedure: measuring a total capacitance of multiple capacitances of an array of the ADC with multiple measurements, while excluding one capacitance of the multiple capacitances with each measurement, the one capacitance being a different capacitance with each measurement; generating a quantity of equations based on the multiple measurements, the quantity of equations being equal to or greater than a quantity of the multiple capacitances; and solving the quantity of equations to determine a capacitance value of each of the multiple capacitances.

In an alternate example, a least squares method (or other mathematic method) may be used to determine the capacitance value of each of the multiple capacitances. In other implementations, other algorithms or procedures may also be used to determine capacitance values of each of the multiple capacitances.

In alternate implementations, other techniques may be included in the process 1000 in various combinations, and remain within the scope of the disclosure.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

The invention claimed is:

1. A built-in self-test, BIST arrangement for an analog-to-digital converter, ADC, comprising:
   a charging circuit arranged to charge at least one capacitance of a capacitor array of the ADC;
   a discharging circuit arranged to discharge the at least one capacitance; and
   a logic portion arranged to evaluate results of the charging circuit and the discharging circuit and to determine whether the ADC is functioning within specified parameters based on the results, at least a portion of the charging circuit and/or the discharging circuit comprising one or more components of the ADC,
   wherein the charging circuit and/or the discharging circuit comprise a switched capacitor discharger circuit arranged to measure a capacitance of the at least one capacitance of the ADC, wherein the switched capacitor discharger circuit comprises an additional capacitor separate from the capacitor array of the ADC, further comprising a comparator and a clock counter, the counter being gated by the comparator, wherein a first input of the comparator is coupled to a node between the capacitor array and the additional capacitor, and a second input of the comparator is to be coupled to a comparator threshold voltage.

2. The BIST of claim 1, wherein the counter stores a value that represents a timing between comparator threshold voltage crossings.

3. The BIST of claim 2, wherein an equal timing between comparator crossings is an indication of a desired capacitor match within a capacitor array of the ADC.

4. The BIST of claim 1, wherein the BIST arrangement is integral to the ADC and is fully contained on an integrated circuit (IC) chip of the ADC.

5. The BIST of claim 1, wherein the charging circuit and/or the discharging circuit use one or more of a switch, a capacitance, or a comparator of the ADC to generate a test stimulus and to evaluate a result of applying the test stimulus to the ADC for testing the ADC.

6. The BIST of claim 1, wherein the logic portion is arranged to control the charging and the discharging of the at least one capacitance and to determine a value for the at least one capacitance.

7. The BIST of claim 1, wherein the BIST is arranged to test a functionality of a capacitor array of the ADC, a comparator of the ADC, a switch of the ADC, and/or a buffer of the ADC.

8. The BIST of claim 1,
   wherein the logic portion is configured to determine a differential nonlinearity or an integral nonlinearity of the ADC based on the results.

9. The BIST of claim 1,
   wherein the BIST is adapted to perform the charging for all capacitances of the capacitor array to obtain a nonlinear equation system, and to solve the equation system to obtain capacitance values.

10. An analog-to-digital converter (ADC), comprising:
    a successive approximation register (SAR) arranged to convert an analog input to a digital approximation;
    a digital-to-analog converter (DAC) capacitance comprising a non-binary-weighted capacitor array of multiple switched capacitances and arranged to convert the digital approximation to an analog form;
    a comparator arranged to compare an analog output of the DAC with the analog input; and
    a built-in self-test (BIST) arranged to test one or more components of the ADC to determine whether the one or more components are functioning within specified parameters, the BIST also comprising one or more of the multiple switched capacitances and/or the comparator, wherein the BIST comprises:
    a charging circuit arranged to charge at least one capacitance of the capacitor array;
    a discharging circuit arranged to discharge the at least one capacitance; and
    a logic portion arranged to evaluate results of the charging circuit and the discharging circuit and to determine whether the ADC is functioning within specified parameters based on the results, at least a portion of the charging circuit and/or the discharging circuit comprising one or more components of the ADC,
    wherein the charging circuit and/or the discharging circuit comprise a switched capacitor discharger circuit arranged to measure a capacitance of the at least one capacitance of the ADC, wherein the switched capacitor discharger circuit comprises an additional capacitor separate from the capacitor array of the ADC, further comprising a comparator and a clock counter, the counter being gated by the comparator, wherein a first input of the comparator is coupled to a node between the capacitor array and the additional capacitor, and a second input of the comparator is to be coupled to a comparator threshold voltage.

11. The ADC of claim 10, further comprising a quantity of switches coupled to the multiple switched capacitances and arranged as a multiplexer to couple each of the multiple switched capacitances to a reference voltage or to ground, or to float during testing of the one or more components of the ADC.

12. The ADC of claim 10 the charging circuit and a discharging circuit being arranged to generate a test stimulus signal and an evaluation circuit arranged to evaluate a result of applying the test stimulus signal to the ADC, wherein the charging circuit, discharging circuit, and evaluation circuit are located on a same chip as the ADC.

13. The ADC of claim 12, wherein the BIST further comprises a comparator set with a dynamic threshold based on a ratio of a single capacitance value of an array of multiple capacitances of the ADC to a total active capacitance value of the array.

14. The ADC of claim 13, wherein the active capacitance value comprises a total capacitance value of the array less a capacitance of one or more of the multiple capacitances that are set to float.

15. The ADC of claim 13 wherein the BIST is arranged to characterize the array of multiple capacitances by measuring thresholds of capacitances representing each bit position of the array successively, the characterizing including determining a capacitance match of the array.

16. The ADC of claim 10, wherein the BIST is fully contained on an integrated circuit (IC) chip of the ADC.

17. A method, comprising:
    charging and discharging at least one capacitance of a capacitor array of an analog-to-digital converter (ADC) using a charging circuit and/or a discharging circuit, wherein the charging circuit and/or the discharging circuit comprise a switched capacitor discharger circuit arranged to measure a capacitance of the at least one capacitance of the ADC, wherein the switched capacitor discharger circuit comprises an additional capacitor separate from the capacitor array of the ADC, further comprising a comparator and a clock counter, the counter being gated by the comparator, wherein a first input of the comparator is coupled to a node between the capacitor array and the additional capacitor, and a second input of the comparator is to be coupled to a comparator threshold voltage;

comparing a charged or discharged voltage of the at least one capacitance to a threshold; and determining a capacitance value of the at least one capacitance based on a passage of time before the threshold is crossed by the charged or discharged voltage, the charging, discharging, comparing, and determining performed using components co-located with the ADC on a single chip.

18. The method of claim 17, further comprising updating a voltage of the threshold when the charged or discharged voltage crosses the threshold.

19. The method of claim 18, further comprising determining the capacitance value of the at least one capacitance based on a quantity of iterations of charging, discharging, and comparing until the charged or discharged voltage crosses the threshold.

20. The method of claim 17, further comprising determining the passage of time based on a clocked counter gated by a comparator arranged to perform the comparing.

21. The method of claim 17, further comprising generating a test stimulus signal using components co-located with the ADC on the single chip and components of the ADC located on the single chip.

22. The method of claim 21, further comprising generating the test stimulus signal without sampling the test stimulus signal.

23. The method of claim 21 further comprising evaluating a result of applying the test stimulus signal to test the ADC using components co-located with the ADC on the single chip.

24. The method of claim 23, further comprising performing the generating and evaluating in the field to determine specification compliance of the ADC and/or to determine effects of aging on components of the ADC.

25. The method of claim 17, further comprising:

measuring a total capacitance of multiple capacitances of an array of the ADC with multiple measurements, while excluding one capacitance of the multiple capacitances with each measurement, the one capacitance being a different capacitance with each measurement;

generating a quantity of equations based on the multiple measurements, the quantity of equations being equal to or greater than a quantity of the multiple capacitances; and solving the quantity of equations to determine a capacitance value of each of the multiple capacitances.

26. The method of claim 17, further comprising testing the ADC to determine capacitor array capacitance matching, transfer curve, and/or static error values, based on the charging, discharging, comparing, and determining.

27. The method of claim 17, further comprising multiplexing at least a portion of a capacitor array of the ADC into the charging circuit and a discharging circuit of a built-in self-test (BIST) arrangement.

* * * * *